(12) United States Patent
Lee

(10) Patent No.: US 6,207,560 B1
(45) Date of Patent: Mar. 27, 2001

(54) METHOD FOR MANUFACTURING THIN-FILM RESISTOR

(75) Inventor: Jia-Sheng Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/221,180

(22) Filed: Dec. 23, 1998

(30) Foreign Application Priority Data

Nov. 18, 1998 (TW) .................................................. 87119076

(51) Int. Cl.[7] .................................................... H01L 21/44
(52) U.S. Cl. ............................................. 438/656; 438/618
(58) Field of Search ...................................... 438/656, 250, 438/238, 240, 672, 618, 637, 639, 724, 740; 430/312, 313, 314, 316, 318, 322

(56) References Cited

U.S. PATENT DOCUMENTS

| | | | |
|---|---|---|---|
| 5,946,567 | * | 8/1999 | Weng et al. .......................... 438/250 |
| 6,051,369 | * | 4/2000 | Azuma et al. ........................ 430/312 |
| 6,063,711 | * | 5/2000 | Chao et al. ........................... 438/724 |
| 6,110,648 | * | 8/2000 | Jang ..................................... 430/312 |

* cited by examiner

*Primary Examiner*—David Nelms
*Assistant Examiner*—Phuc T. Dang

(57) ABSTRACT

A dual damascene method is described for manufacturing a multilevel metal interconnect with a thin film resistor. A substrate is provided. An insulating layer is formed on the substrate. A dual damascene structure is formed in the insulating layer. A thin film resistor layer is formed over the substrate and the thin film resistor layer is patterned to form a thin film resistor.

11 Claims, 4 Drawing Sheets

METHOD FOR MANUFACTURING THIN-FILM RESISTOR

BACKGROUND OF THE INVENTION

1. Field of the Invention

The present invention relates to a method for manufacturing a semiconductor device. More particularly, the present invention relates to a dual damascene method for manufacturing a multilevel metal interconnect with a thin film resistor.

2. Description of the Related Art

Dual damascene is a technique that the via plugs and the wire are formed in the same step. The dual damascene comprises the steps of forming an insulating layer on the substrate and planarizing the insulating layer. The insulating layer is patterned to formed trenches and via holes for predetermined wire and via plugs respectively. The trenches and the via holes are filled with conductive material to form wires and via plugs.

The resistor is one of the most common electrical components widely used in almost every electrical device. A semiconductor device, mostly an integrated circuit, including memories and logical devices normally consists of resistors and other electrical components. The resistance provided by a resistor is proportional to the length of the resistor and the reciprocal of the cross-sectional area of the resistor; both are measured in the direction of the current. That is, the resistance of a resistor fulfills the following equation:

$$R = \rho \frac{L}{A},$$

Wherein $\rho$ is the resistivity of the resistor, L and A are the length and the cross-sectional area of the resistor respectively, and wherein both L and A are measured in the direction of the current.

Conventionally, doped polysilicon is used as the material of a resistor in a semiconductor fabrication process, wherein the resistance is controlled by predetermined L and A of the doped polysilicon layer.

As the integration of a semiconductor device is increased, all components within a semiconductor integrated circuit have to provide equivalent or better electrical properties. Hence, a downsized resistor still has to provide a required resistance. However, a conventional resistor made of doped polysilicon can only provide a limited resistance within a limited space because of the property of polysilicon. Using polysilicon resistor to provide a relatively high resistance then becomes a problem in designing and fabricating a highly integrated semiconductor device.

For overcoming the foregoing problem, new materials like CrSi having a higher resistivity than what of polysilicon are applied on the fabrication of a thin-film resistor of a highly integrated semiconductor device.

FIGS. 1A through 1E are schematic, cross-sectional views of the conventional process for manufacturing a thin-film resistor.

As shown in FIG. 1A, a substrate 100 having an insulating layer 102 is provided. A CrSi layer 104 is formed on the insulating layer 102. An aluminum layer 106 is formed on the CrSi layer 104. The aluminum layer 106 is used to prevent the CrSi layer 104 from being damaged by the sequential dry etching process.

As shown in FIG. 1B, an aluminum layer 106a is formed by patterning the aluminum layer 106.

As shown in FIG. 1C, an etching step is used to remove portions of the CrSi layer 104 exposed by the aluminum layer 106a. The remaining CrSi layer is denoted by 104a. A via hole 110 is formed by patterning the insulating layer 102. The remaining insulating layer is denoted by 102a. A conductive layer 112 is formed over the substrate 100 and fills the via hole 110.

As shown in FIG. 1D, a wire 112a and a via plug 110a are formed by patterning the conductive layer 112.

As shown in FIG. 1E, the aluminum layer 106a is removed to expose the surface of the CrSi layer 104a.

Even though the aluminum layer is capable of protecting the CrSi layer from the damages caused by dry etching processes, the provided protection is limited. Normally, the CrSi layer still get damaged by the dry etching process even in the presence of the aluminum layer if more than two dry etching processes are performed. Moreover, the conventional procedure is so complicated that the costs are high.

SUMMARY OF THE INVENTION

It is therefore an objective of the invention provides a dual damascene method of manufacturing an interconnect with a thin-film resistor to prevent the thin-film resistor from plasma damage due to subsequent processes.

It is another an objective of the invention which provides a dual damascene method of manufacturing an interconnect with a thin-film resistor to reduce the costs.

To achieve these and other advantages and in accordance with the purpose of the invention, as embodied and broadly described herein, the invention provides a dual damascene method for manufacturing a multilevel metal interconnect with a thin film resistor. A substrate is provided. An insulating layer is formed on the substrate. A dual damascene structure is formed in the insulating layer. A thin film resistor layer is formed over the substrate and the thin film resistor layer is patterned to form a thin film resistor. Since dual damascene technique is performed before the thin-film resistor is formed, it can prevent the thin-film resistor from plasma damage caused by dry etching processes. Furthermore, it is unnecessary to form an aluminum layer on the thin-film resistor, thus, the procedure can be simplified and the costs can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
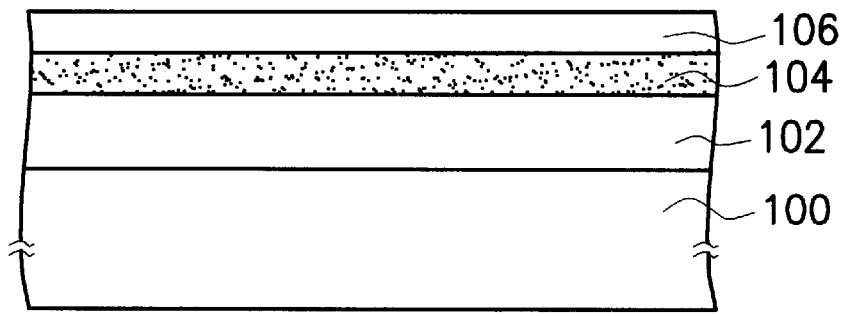
FIGS. 1A through 1E are schematic, cross-sectional views of the conventional process for manufacturing a thin-film resistor.
Figure 1B:
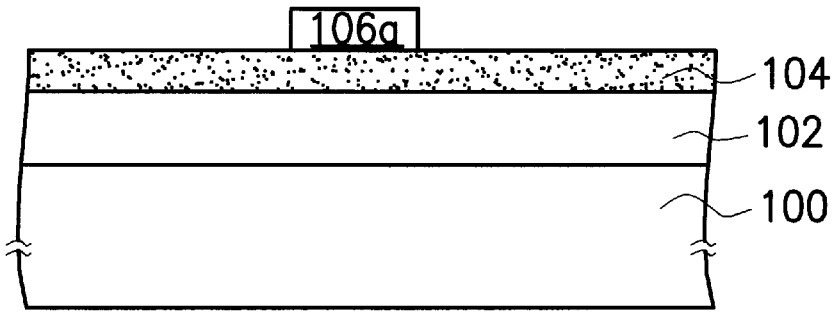
Figure 1C:
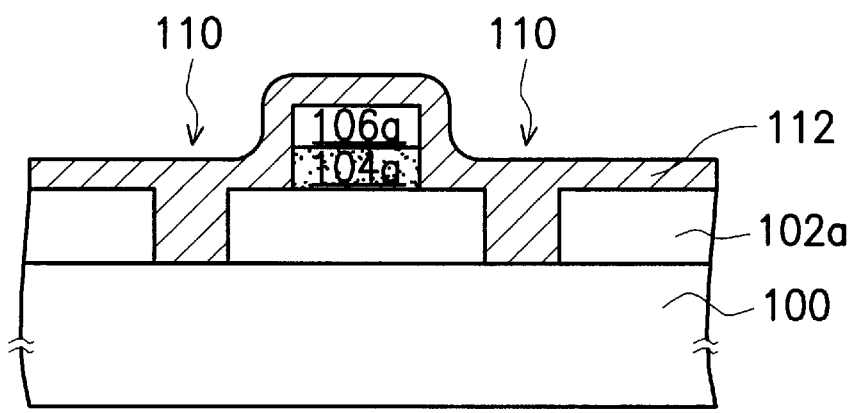
Figure 1D:
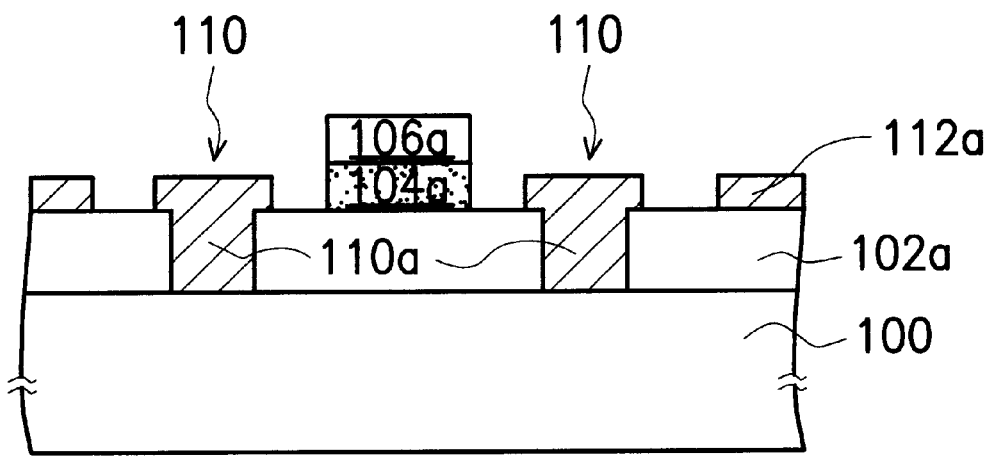
Figure 1E:
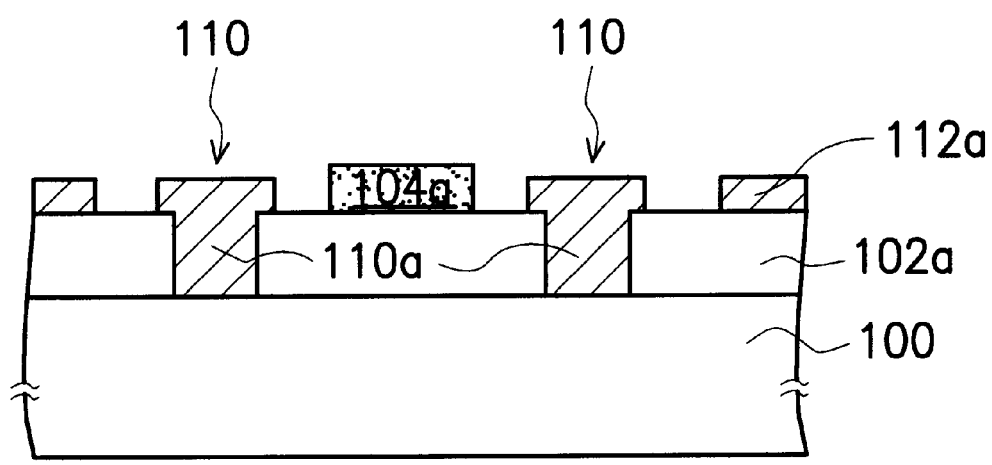

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views of the dual damascene method for manufacturing a multilevel metal interconnect with a thin film resistor in a preferred embodiment according to the invention.

Figure 2A:
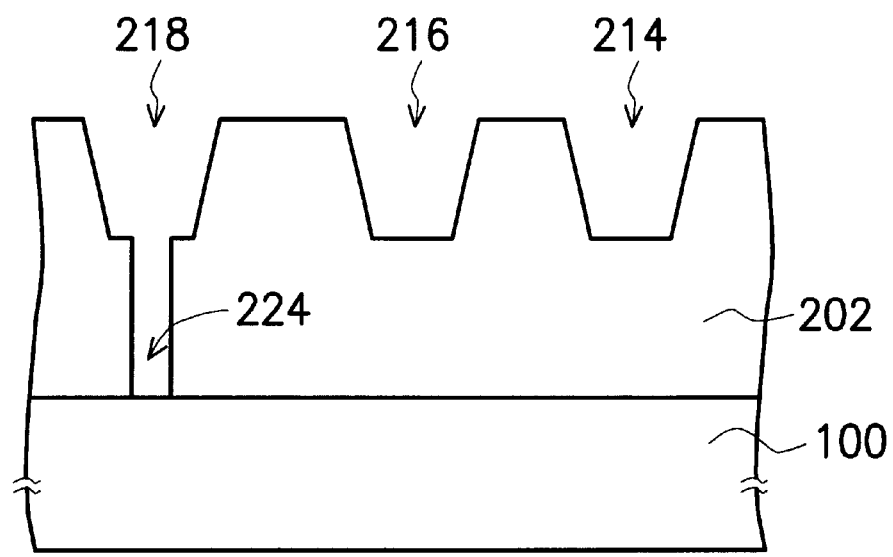
FIGS. 2A through 2D are schematic, cross-sectional views of the dual damascene method for manufacturing a multilevel metal interconnect with a thin film resistor in a preferred embodiment according to the invention.

As shown in FIG. 2A, an insulating layer 202 is formed on a substrate 200. The insulating layer 202 can be a borophosphosilicate glass layer formed by chemical vapor deposition, for example. Trenches 214, 216 and 218 and a via hole 224 are formed in the insulating layer 202 by patterning the insulating layer 202. The via hole 224 is formed within the trench 218 to expose the substrate 200.

Figure 2B:
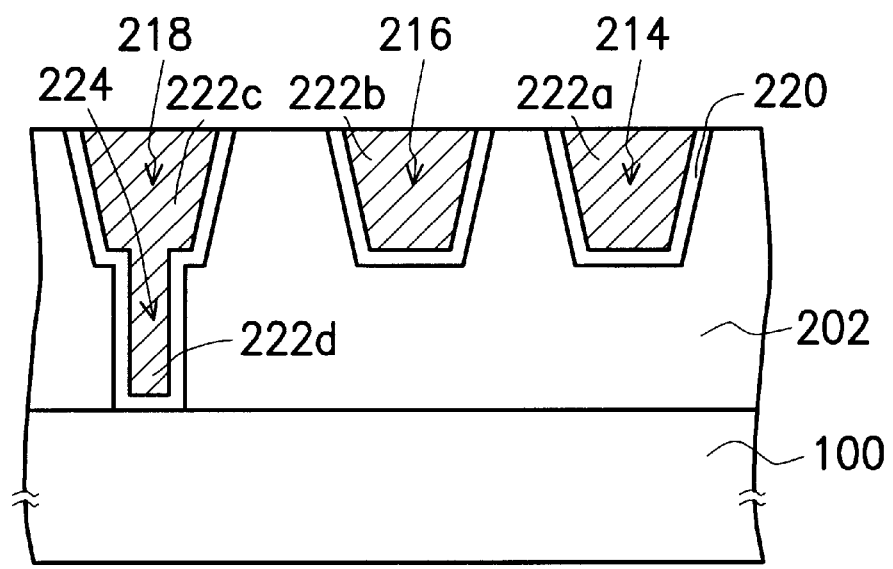

As shown in FIG. 2B, a barrier layer 220 is conformally formed in the trenches 214, 216 and 218 and the via hole 224. The barrier layer 220 can be a tantalum nitride layer. The barrier layer 220 is used as an intermediate layer to prevent the interaction of subsequently formed conductive material with insulating material. Wires 222a, 222b and 222c and a via plug 222d is formed by filling the trenches 214, 216 and 218 and the via hole 224 with a conductive material. The via plug 222d is electrically coupled to the substrate 200. The conductive material can be copper or copper alloy. In this example, the method of forming the barrier layer 220, the wires 222a, 222b and 222c and the via plug 222d comprises the steps of forming a conformal barrier layer (not shown) on the insulating layer 202 and in the trenches 214, 216 and 218 and the via hole 224. A conductive layer (not shown) is formed on the barrier layer and fills the trenches 214, 216 and 218 and the via hole 224. A portion of the conductive material on the insulating layer 202 is removed by the planarizing step such as chemical-mechanical polishing or etching back to expose the surface of the insulating layer 202 and to form the wires 222a, 222b and 222c and the via plug 222d. The procedure mentioned above is a kind of dual damascene techniques. Conventionally, if more than two dry etching processes are performed, the thin-film resistant layer would suffer from plasma damage even in the presence of the aluminum layer. Since dual damascene technique is performed before the thin-film resistant layer 204 is formed, it can prevent the thin-film resistant layer 204 from plasma damage caused by dry etching processes.

Figure 2C:
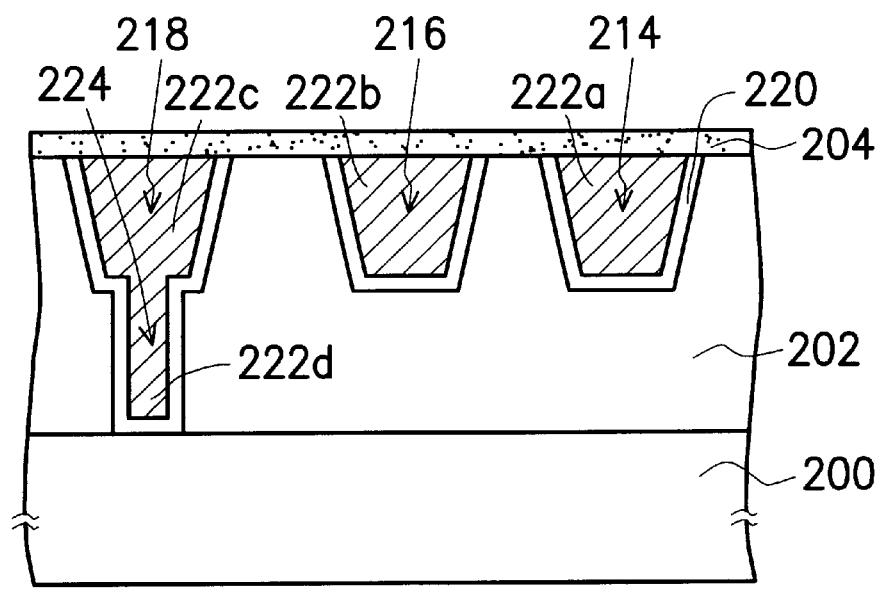

As shown in FIG. 2C, a thin-film resistant layer 204 is formed over the substrate 200. The method of forming the thin-film resistant layer includes sputtering or chemical vapor deposition. The thin-film resistant layer 204 can be a CrSi layer sputtered over the substrate 200 at a temperature of about 300° C.

Figure 2D:
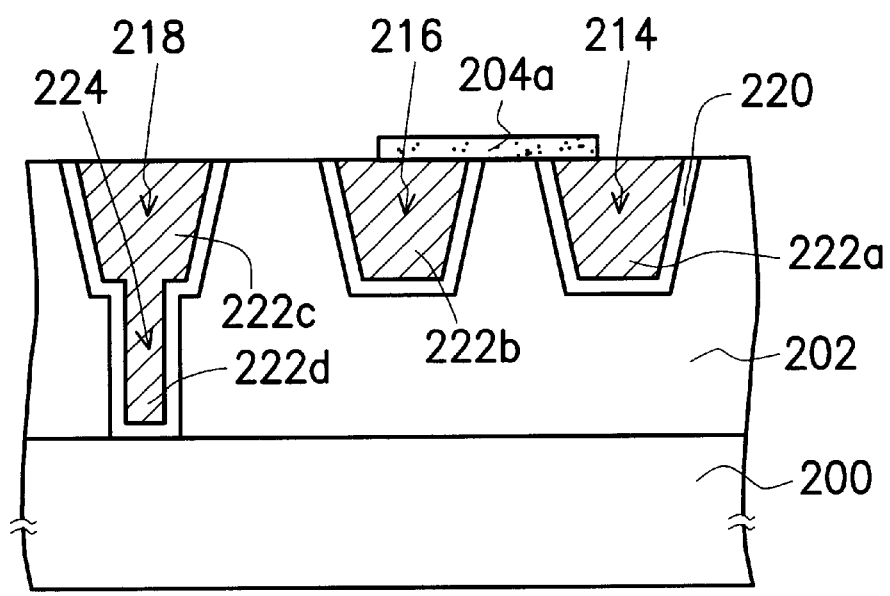

As shown in FIG. 2D, a patterned photoresist layer (not shown) is formed on the thin-film resistant layer 204. An etching step is used to remove portions of the thin-film resistant layer 204 exposed by the patterned photoresist layer. The remaining thin-film resistant layer 204 is a thin-film resistor 204a. The photoresist layer is stripped away to expose the surface of the thin-film resistor 204a. The method of stripping away the photoresist layer includes wet etching. The thin-film resistor 204a is formed after dual damascene technique is performed, so that it is unnecessary to form an aluminum layer on the thin-film resistant layer 204 to protect the thin-film resistant layer 204 from plasma damage due to dry etching processes. Consequently, the procedure can be simplified, and the costs can be reduced. Additionally, the thin-film resistor 204a made of CrSi in the invention is more stable than the conventional resistor made of doped polysilicon. Moreover, the thin-film resistor 204a can provide relatively high resistance when the size of the thin-film resistor 204a is reduced, therefore, the integration of a semiconductor device is increased.

Altogether, the present invention include at least the following advantages:

1. In the invention, dual damascene technique is performed before the thin-film resistant layer is formed, it can prevent the thin-film resistant layer from plasma damage caused by dry etching processes.

2. In the invention, The thin-film resistor is formed after dual damascene technique is performed, so that it is unnecessary to form an aluminum layer on the thin-film resistant layer. Therefore, the procedure can be simplified, and the costs can be reduced.

3. In the invention, the thin-film resistor can provide relatively high resistance when the size of the thin-film resistor is reduced, therefore, the integration of a semiconductor device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene method for manufacturing a multi-level metal interconnect with a thin film resistor, comprising the steps of:

providing a substrate;

forming an insulating layer on the substrate;

forming a dual damascene structure in the insulating layer;

forming a thin film resistor layer over the substrate; and patterning the thin film resistor layer to form a thin film resistor.

2. The method of claim 1, wherein the thin film resistor layer includes a chromium silicon layer.

3. The method of claim 2, wherein the step of forming the dual damascene further comprising the steps of:

patterning the insulating layer to form a first and a second trenches;

forming an via hole in the second trench to expose the surface of the substrate; and filling both the first and the second trenches and the via hole with a conductive material to form a first and a second wires and a via plug.

4. The method of claim 3, wherein the conductive material is selected from a group consisting of copper and copper alloy.

5. The method of claim 3, further comprising, between the step of forming the via hole and the step of forming the first and the second wires and the via plug, the steps of:

forming a conformal barrier layer in the first and the second trenches and the via hole and over the substrate;

forming a conductive layer on the barrier layer and filling the first and the second trenches and the via hole; and removing portions of the conductive layer and the barrier layer and exposing the surface of the insulating layer.

6. The method of claim 5, wherein the barrier layer includes a tantalum nitride layer.

7. The method of claim 1, wherein the step of forming the thin film resistor layer includes a sputtering step which is performed at a temperature of about 300° C.

8. The method of claim 1, wherein the step of forming the thin film resistor layer includes chemical vapor deposition.

9. The method of claim 1, wherein the step of forming the dual damascene further comprising the steps of:

patterning the insulating layer to form a first and a second trenches;

forming an via hole in the second trench to expose the surface of the substrate; and filling both the first and the second trenches and the via hole with a conductive material to form a first and a second wires and a via plug.

10. The method of claim 9, further comprising, between the step of forming the via hole and the step of forming the first and the second wires and the via plug, the steps of:

forming a conformal barrier layer in the first and the second trenches and the via hole and over the substrate;

forming a conductive layer on the barrier layer and filling the first and the second trenches and the via hole; and removing portions of the conductive layer and the barrier layer and exposing the surface of the insulating layer.

11. The method of claim 10, wherein the barrier layer includes a tantalum nitride layer.

* * * * *